United States Patent [19]

Kubozono et al.

[11] Patent Number: 5,506,772
[45] Date of Patent: Apr. 9, 1996

[54] TROUBLE-DIAGNOSIS MULTI-FUNCTION TESTER

[75] Inventors: Tsutomu Kubozono; Minoru Tatemoto, both of Tokyo; Shigeaki Hirano; Hirotoshi Maekawa, both of Himeji, all of Japan

[73] Assignee: Mitsubishi Denki Kabushiki Kaisha, Tokyo, Japan

[21] Appl. No.: 425,357

[22] Filed: Oct. 20, 1989

Related U.S. Application Data

[63] Continuation of Ser. No. 176,311, Mar. 31, 1988, abandoned.

[30] Foreign Application Priority Data

Mar. 31, 1987 [JP] Japan ................................. 62-46822 U
Mar. 31, 1987 [JP] Japan ................................. 62-46824 U

[51] Int. Cl.⁶ ........................................................ G01M 15/00
[52] U.S. Cl. ........................... 364/424.03; 364/431.01; 364/551.01
[58] Field of Search .................. 364/431.01, 431.03, 364/424.03, 424.04, 551.01, 431.12; 73/116, 117.2; 371/20; 395/905, 913

[56] References Cited

U.S. PATENT DOCUMENTS

| | | | |
|---|---|---|---|
| 4,084,240 | 4/1978 | Lappington | 364/431.04 |
| 4,234,921 | 11/1980 | Kinoshita et al. | 364/431.01 |
| 4,404,639 | 9/1983 | McGuire et al. | 364/424.04 |
| 4,476,531 | 10/1984 | Marino et al. | 364/431.01 |
| 4,602,127 | 7/1986 | Neely et al. | 364/431.03 |
| 4,677,558 | 6/1987 | Böhmler et al. | 364/431.04 |
| 4,694,408 | 9/1987 | Zaleski | 364/431.01 |
| 4,757,463 | 7/1988 | Ballou et al. | 364/424.04 |
| 4,796,206 | 1/1989 | Boscove et al. | 364/551.01 |
| 4,831,560 | 5/1989 | Zaleski | 364/551.01 |
| 4,862,371 | 8/1989 | Maekawa | 364/551.01 |
| 4,962,456 | 10/1990 | Abe et al. | 364/551.01 |

FOREIGN PATENT DOCUMENTS

| | | | |
|---|---|---|---|
| 61-132173 | 3/1986 | Japan . | |
| 0006857 | 1/1987 | Japan | 364/424.04 |
| 0006858 | 1/1987 | Japan | 364/424.04 |

OTHER PUBLICATIONS

"On–Board Computer Testing", Automotive Engineering, Nov. 1976, pp. 30–33.

*Primary Examiner*—Vincent N. Trans
*Attorney, Agent, or Firm*—Oblon, Spivak, McClelland, Maier & Neustadt

[57] ABSTRACT

A trouble-diagnosis multi-function tester for diagnosing presence or absence of occurrence of trouble by centralized inputting of the operational information in every element of the vehicle, which is constructed with a tester which introduces input information of various vehicles through a centralized connector provided at the side of the vehicle, and displays the contents of the input information; and a computer which controls the vehicle information to be transmitted as an output through an outer expansion terminal of the tester.

6 Claims, 4 Drawing Sheets

TROUBLE-DIAGNOSIS MULTI-FUNCTION TESTER

This application is a Continuation of application Ser. No. 176,311, filed Mar. 31, 1988, now abandoned.

BACKGROUND OF THE INVENTION

1. Field of the Invention

This invention relates to a trouble-diagnosis multi-function tester which is capable of diagnosing presence or absence of failures in operation of various constituent element in an automotive vehicle by centralized inputting of operational information contained in them.

2. Decsription of the Invention

In recent years, automotive vehicles tend to be equipped in various constituent elements thereof with more and more electronic controlling devices. As an example, electronically controlled fuel injection device, electronically controlled power transmission device, full-automatic air-conditioning device, and so forth have widely been put into practical use. As such, those vehicles in which electronic controlling devices have been installed are seen to have attained remarkable improvement in its cruising characteristic and habitability, while, on the other hand, when trouble takes place in the control system, it becomes very difficult to find out the place in the vehicle where the abnormality has occured.

Therefore, in those vehicles equipped with the electronically controlled fuel injection apparatus, the electronically controlled power transmission system, and so forth, which imparts a large influence on the cruising function of the vehicle, when the trouble occurs therein, there is provided in advance a diagnosing system (trouble-diagnosis function) to enable each and every system in the vehicle to be readily inspected. Namely, this diagnosing system is to find out presence or absence of abnormality in every part of the automotive vehicle by introducing into the diagnosis tester through a centralized connector those abnormality checking output signals which are produced from every controlling system itself, displaying the abnormality checking signal, and comparing the displayed pattern with a regular signal pattern.

However, with the diagnosis system as mentioned above, since the input checking signals to be repeatedly introduced from each and every controlling system are displayed in real-time, any abnormal signals can be promptly discovered when a certain abnormality takes place frequently, but it is very difficult to ascertain the abnormal signals when such abnormality occurs from time to time or in a rare occasion. Also, when a plurality of checking signals indicate abnormality owing to a signal cause of trouble, it requires a long period of time for assuming the above-mentioned cause for trouble based on each of the abnormal signal information thereof, because such information available to an operator are merely those abnormal information.

SUMMARY OF THE INVENTION

The present invention has been made with a view to removing the point of problem as mentioned above, and aims at providing a trouble-diagnosis multi-function tester which is capable of finding out easily and without failure the cause for trouble in operation of the vehicle in a short period of time, even if the abnormal signals are generated less frequently.

According to the present invention in general aspect of it, there is provided a trouble-diagnosis multi-function tester for diagnosing presence or absence of occurrence of trouble by centralized inputting of the operational information in every element of the vehicle, said trouble-diagnosis multi-function tester being characterized by comprising: a tester which introduces input information of various vehicles through a centralized connector provided at the side of the vehicle, and displays the contents of the input information; and a computer which controls said vehicle information to be transmitted as an output through an outer expansion terminal of said tester.

The foregoing object, other objects as well as the specific construction and function of the trouble-diagnosis multi-function tester according to the present invention will become more apparent and understandable from the following detailed description thereof, when read in conjunction with the accompanying drawing illustrating a couple of preferred embodiments thereof.

BRIEF DESCRIPTION OF THE ACCOMPANYING DRAWING

DETAILED DESCRIPTION OF PREFERRED EMBODIMENTS

Figure 1:
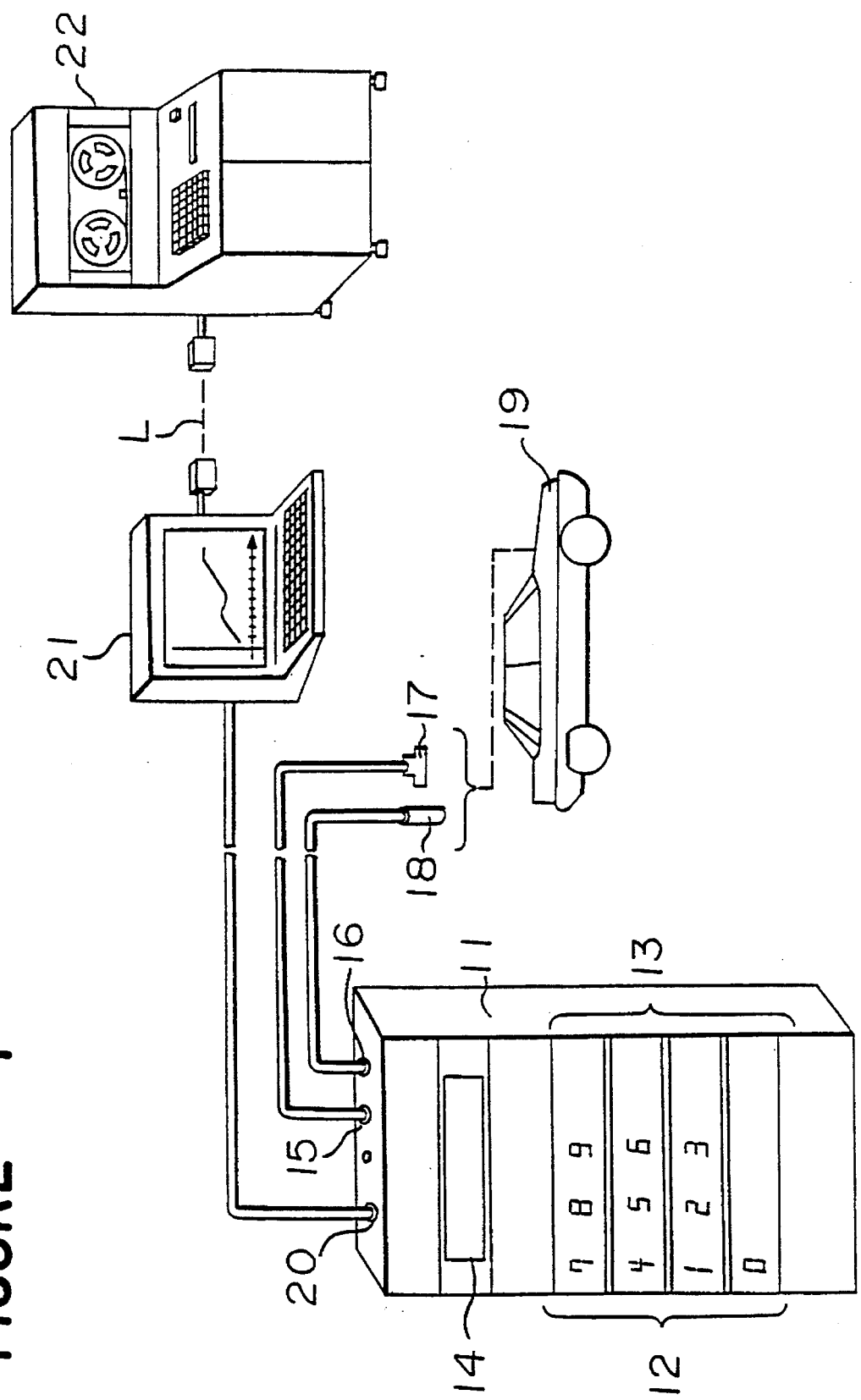
FIG. 1 is a schematic constructional diagram showing an overall arrangement of the trouble-diagnosis multi-function tester according to one embodiment of the present invention.

Referring first to FIG. 1 which illustrates an overall arrangement of the trouble-diagnosis multi-function tester according to the first embodiment of the present invention, a reference numeral 11 designates a multi-use tester having a front panel, in which a ten-key 12, function keys 13 and a display window 14 are arranged. Also, on the top part of this multi-use tester 11, there are provided a vehicle data input terminal 15 and a power source input terminal 16. A centralized connector 17 having 12 pins is attached to the end of a signal cable to the side of the data input terminal 15, while a cigarette lighter connector 18 is attached to the end of a cable to the side of the power source input terminal 16. The 12-pin centralized connector 17 is inserted into a centralized connector which is provided in advance beneath the dash-board, etc. of an automobile 19 and from which checking signals of various control systems are led out, while the cigarette lighter connector 18 is inserted into a cigarette lighter chuck which is provided in the dash-board of the automobile 19 and at which electric power of 12 V is led out of a battery source. Namely, the multi-use tester 11 has its functions of introducing an input checking signal from each of the control systems in the vehicle 19 and displaying in its display window 14 a message as to presence or absence of abnormal signal from each and every constituent element of the vehicle, the switching of its display function being selected by, for example, combination of the ten-key 12 and the function keys 13. In this case, by actuating "DIAG" of the function key 13, each of the control system can be inspected.

On the top part of the multi-use tester 11, there is further provided an external expansion terminal 20, from which a transmission cable (data bus) is extended. To this transmission cable, there is connected a general purpose personal computer 21. From the outer expansion terminal 20 of the multi-use tester 11 to the personal computer 21, there is forwarded the inspection data for operation of each part of the vehicle are inputted from the side of the vehicle 19 at the inspection mode "DIAG"of the control system of the vehicle. The personal computer 21 receives the inspection data of each part of the vehicle and carries out various controls such as memory or statistics of the data, depending on necessity. In addition, this personal computer 21 is connected with a large-scale computer 22 to be installed in, for example, an office site through a telephone line L using a modem, and diagnosis of the place where abnormality has occurred is performed depending on necessity based on a number of vehicle inspection information which are controlled by the personal computer 21. The result of the disgnosis by this large-scale computer 22 is again forwarded to the personal computer 21 through the telephone line L, and then transmitted to the multi-use tester 11 to be displayed on the message display window.

In other words, in the trouble-diagnosis multi-function tester of the above-described construction, when the multi-use tester 11 is set to the vehicle inspection mode "DIAG", the inspection signals of the selected control systems are introduced as inputs in their preferential sequence.

Figure 2:
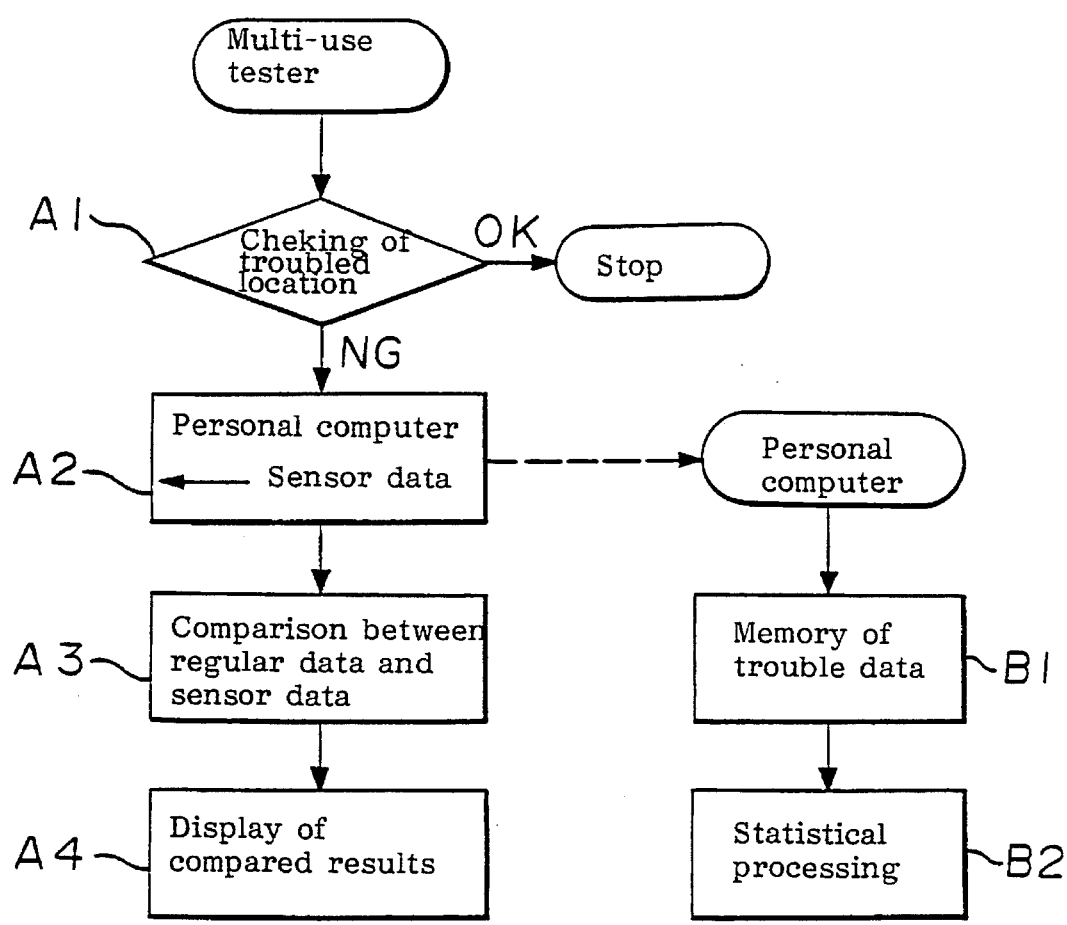
FIG. 2 is a flow chart showing diagnostic processing operations on an automotive vehicle by means of the trouble-diagnosis multi-function tester in FIG. 1.

FIG. 2 is a flow chart showing the failure diagnosing operations between the multi-use tester 11 and the personal computer 21. When the sensor data provided in each part of the control system to be the vehicle inspection data are introduced as input into the multi-use tester 11, presence or absence of abnormal codes in the sensor data is determined. If no abnormality is present, the diagnosing operation is terminated, while, if such abnormality is present, the abnormal sensor data are transmitted from the outer expansion terminal 20 to the personal computer 21 (Steps A1 and A2). Then, the abnormal sensor data which have been transmitted are sequentially stored in the personal computer 21, and, at the same time, the computer carries out appropriate statistical processing by the key input instruction from an operator, and performs, for example, searching of a location where abnormality occurs at less frequency (Steps B1 and B2). In this case, the personal computer 21 carries out statistical processing on the basis of sensor data to be stored over a long period of time, so that the principal cause for trouble can be estimated and searched out easily.

On the other hand, after transmission of the vehicle sensor data, comparison is done in the multi-use tester 11 between the regular data which are stored therein in advance and the sensor data for inspection. If the result of the comparison reveals that there is no abnormality, for example, a message reading: "NO ABNORMALITY" is displayed in the display window 14; and if there is abnormality, a message reading: "11.02 SENSOR DS (which means "abnormal data exist in 02 sensor")" is displayed (Step A3 and A4). In this case, if it is desired that the location where failure has occurred in the vehicle 19 be specified, the personal computer 21 is on-line connected with the large-scale computer 22 at the office site to have the vehicle data to be exchanged between them in accordance with the instruction from the large-scale computer 22. Upon this exchange of the vehicle data, the troubled location is analyzed at the side of the large-scale computer 22 on the basis of the necessary vehicle data and the resulting data are returned to the personal computer 21, whereby the abnormal location in a control system which is difficult to be specified by an operator himself becomes able to be found in a short period of time and without failure.

In the following, the second embodiment of the present invention will be described in reference to FIGS. 3 and 4. In the drawing, the same parts as in FIG. 1 will be designated by the same reference numerals.

Figure 3:
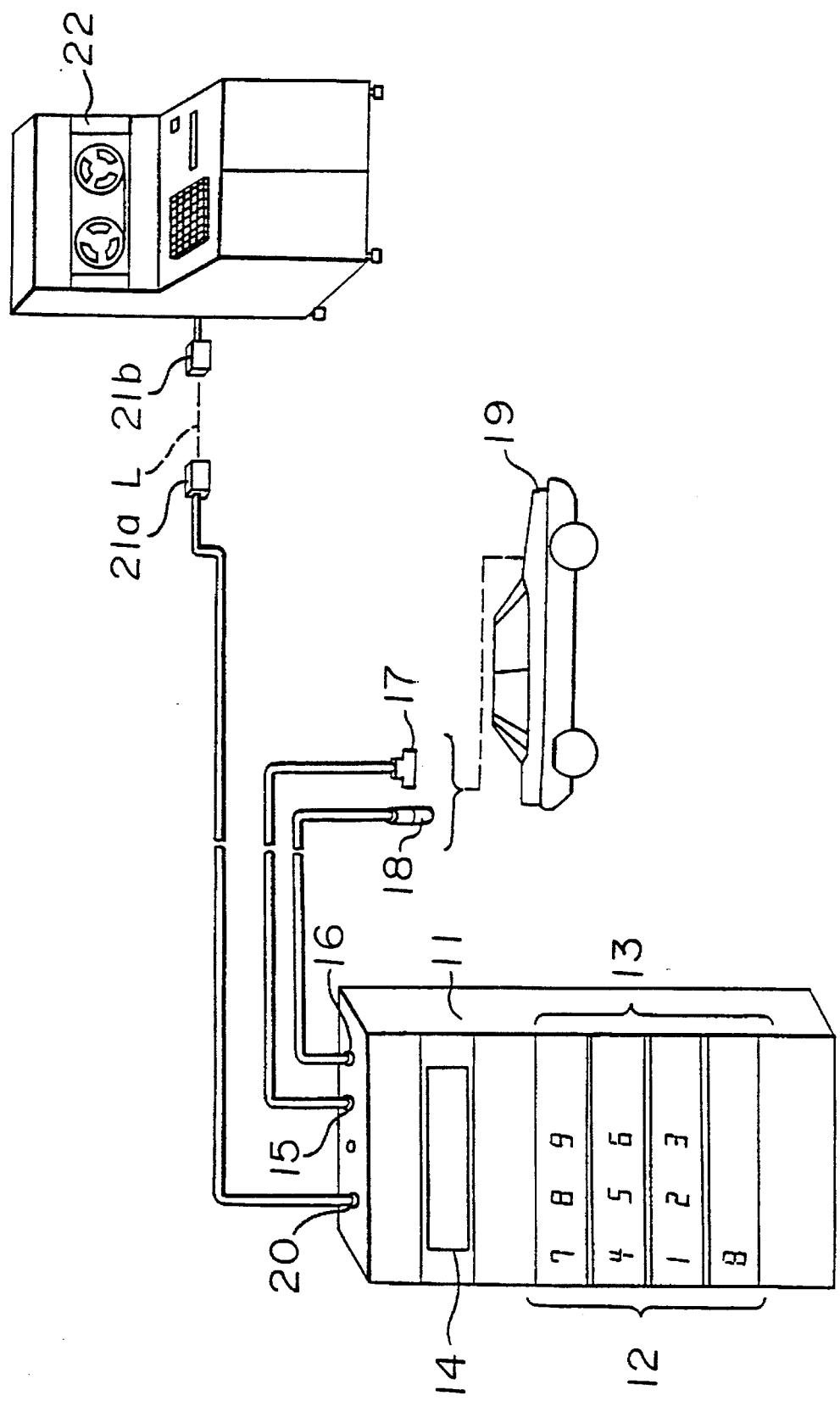
FIG. 3 is a schematic constructional diagram showing an overall arrangement of the trouble-diagnosis multi-function tester according to another embodiment of the present invention.

In FIG. 3, a transmission cable (data bus) is extended from the outer expansion terminal 20 provided on the top part of the multi-use tester 11. To this transmission cable, there is connected an artificial intelligence (AI) computer 22 installed at the office site through a telephone line L using the modem 21a and 22. From the outer expansion terminal 20 of the multi-use tester 11 to the AI computer 22, there is forwarded the inspection data for operation of every element in the vehicle, which are to be introduced as the input from the side of the vehicle 19 by the data-collecting instruction from the side of the AI computer 22, in the inspection mode "DIAG" of every control system in the vehicle. On the basis of these inspection data of those parts in the vehicle to be obtained and a number of trouble diagnosing data to be memorized beforehand, the AI computer 22 carries out the diagnosis of the location where the failure has taken place. The result of the diagnosis by the AI computer is again transmitted to the multi-use tester 11 through the telephone line L and displayed in message on the display window 14.

Namely, in the trouble-diagnosis multi-function tester of the above described construction, when the multi-use tester 11 is set in the vehicle inspection mode "DIAG", the inspection signals of the selected control systems are introduced thereinto in the predetermined preferential sequence.

Figure 4:
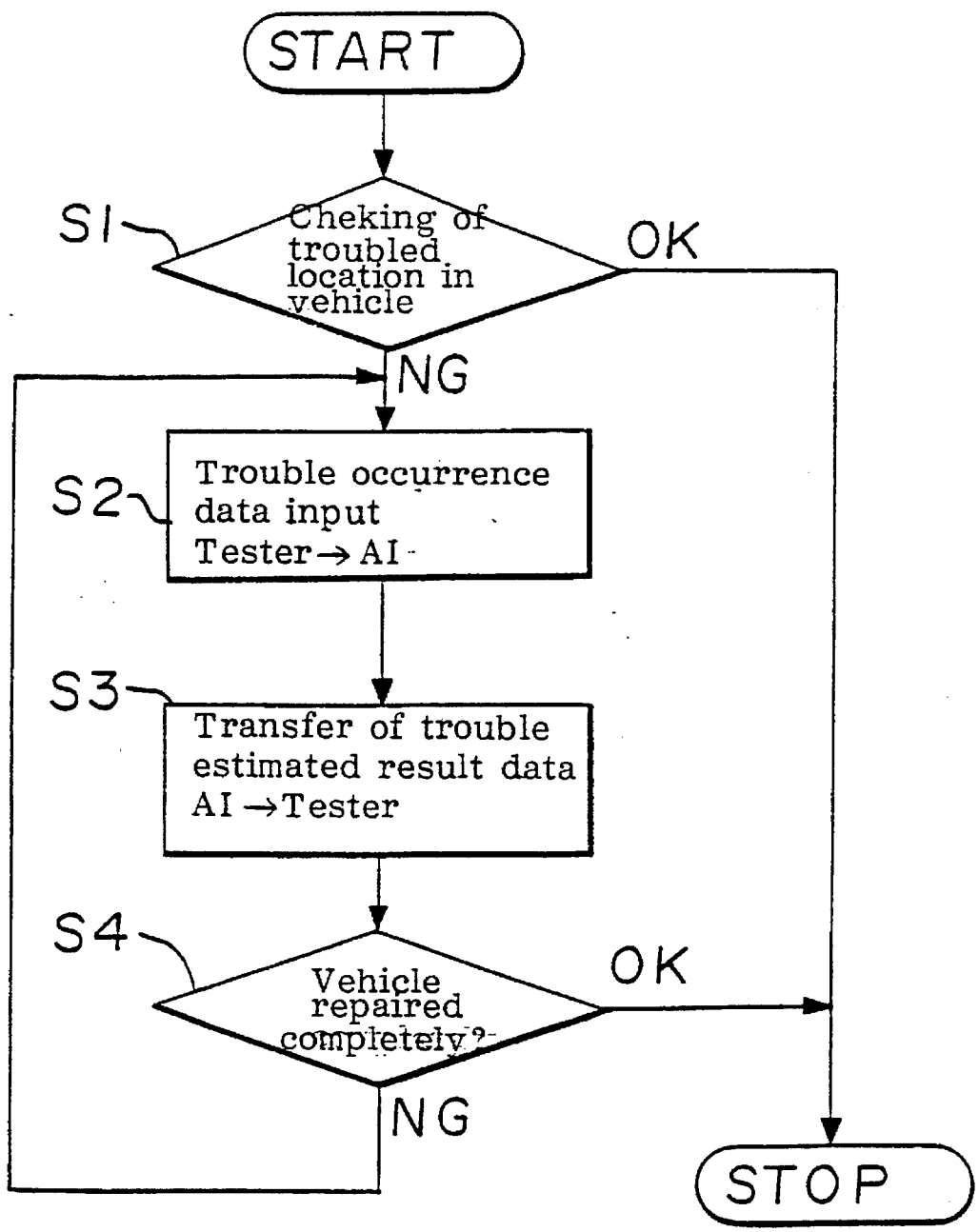
FIG. 4 is a flow chart showing diagnostic processing operations on failures by means of the trouble-diagnosis multi-function tester in FIG. 3.

FIG. 4 is a flow chart showing the failure diagnosing operations between the multi-use tester 11 and the AI computer 22. When the sensor data provided in every part of the control systems to constitute the vehicle inspection data are introduced as input into the multi-use tester 11, presence or absence of abnormal codes in the sensor data is determined. If no abnormality is present, the diagnosing operation is terminated, while, if such abnormality is present, the abnormal sensor data are transmitted from the outer expansion terminal 20 to the AI computer 22 (Steps A1 and A2). Then, the AI computer 22 by its artificial intelligence function instructs the multi-use tester 11 to collect the abnormal sensor data which have been transmitted as well as the vehicle data necessary for the failure diagnosis. Thereafter, as soon as the required data have been collected, the troubled location is diagnosed by estimation on the basis of a number of diagnosing data to be memorized beforehand and the failure-related data obtained from the vehicle 19. The thus obtained data of the estimated results are forwarded from the AI computer 22 to the multi-use tester 11, and displayed in message on the display window 14 (Steps S2 and S3). In other words, by on-line connection of the multi-use tester 11 which takes the input vehicle information in a centralized manner with the AI computer 22 having the artificial intelligence function and being installed at the office site, and by performing exchange of the vehicle data between them in accordance with the instruction from the AI computer 22, the troubled location is analyzed on the basis of the required vehicle data, the resulted data of which are displayed in the multi-use tester 11 to the operator's knowledge. Here, the operator effects repairing of the vehicle in accordance with the trouble-diagnosed message displayed on the above-mentioned multi-use tester 11. After the repairing, if there still occurs failure in operation, the data collection and the trouble diagnosing process from the afore mentioned Step S2 onward are again repeated (Step S3), whereby it becomes possible to find out in a short period of time and without failure any abnormal location in the control system which is difficult to specify by the operator himself. As the consequence, the operator is liberated from making laborious efforts in diagnosing and specifying the troubled location.

In the afore described embodiment, the multi-use tester 11 is so constructed as to be on-line connected with the AI computer 22 to be installed at the office site through the telephone line L. However, if it is so constructed that a small-sized artificial intelligence pack, etc. for example, is directly connected with the multi-use tester 11 so as to provide the multi-use tester per se with the artificial intelligence function, there is no necessity for the on-line connection with the consequence that the failure diagnosis processing can be done without bringing the vehicle into the dealer factory, even in the case of on-the-stop repairing services.

As described in the foregoing, since the trouble-diagnosis multi-function tester according to the present invention is so constructed that the outer expansion terminal is provided in the tester, into which the inspection signals from every control system of the vehicle are introduced in a centralized manner, the vehicle information to be transmitted are imparted to the computer through the outer expansion terminal, and controlling, taking statistics, and so forth of each of the vehicle information are continuously carried out by the computer to thereby facilitate searching of the cause for trouble, even when the abnormal signal does not occur frequently, the troubled location can be found in a short period of time and without failure. Further, when an information processing device having the artificial intelligence function is employed, the operator himself does not have to effect the failure diagnosis, and even a complicated trouble can be located easily and certainly.

Although in the foregoing the present invention has been described in detail with reference to a couple of preferred embodiments thereof, the invention is not limited to these embodiments alone, but any changes and modifications may be made by those persons skilled in the art within the spirit and scope of the invention as set forth in the appended claims.

What is claimed is:

1. A connection system for trouble-diagnosis multi-function tester which diagnoses the presence or absence of occurrence of abnormalities in the operation of, by centralized inputting of the operational information, in elements of a motor vehicle, said connection system comprising:

a tester which introduced input information from various vehicles through a centralized connected provided at the side of each of said vehicles, and displays the contents of the input information; and at least two connections from said tester to provide inputs and outputs, the first of which is coupled to a separate computer which controls the processing of said vehicle information so that said vehicle information is transmitted as an output through the second of said connection, and such that said information transmitted by said second connector is transmitted to a central location for collection and further processing.

2. A system according to claim 1, wherein said tester includes a front panel, in which ten-key, function keys and a display window are arranged, and which includes on the top part thereof said outer expansion terminal, a vehicle data input terminal and a power source input terminal.

3. A system according to claim 2, wherein said trouble-diagnosis multi-function tester determines the presence or absence of abnormalities by comparing various vehicle information with prestored data indicative of normal conditions within the vehicle which has been memorized on the basis of various sensor data to be sent through said centralized connector, and, when it determines that an abnormality exists, it displays said abnormality in said display window.

4. A system according to claim 2, wherein vehicle data for elements in the vehicle are forwarded to said computer by the operation of the function keys, where the abnormality has occurred within said motor vehicle is diagnosed, the result of which is displayed on the display window of the tester.

5. A trouble-diagnosis multi-function system comprising:

a multi-function tester having a vehicle data input terminal for inputting information directly from a vehicle through a centralized connector;

an artificial intelligence computer, which has memorized beforehand diagnosing data, remotely connected to the multi-function tester through an external expansion terminal for estimating a location of a malfunction within the vehicle based on abnormality signals downloaded to the artificial intelligence computer from the multi-function tester; and wherein, the artificial intelligence computer downloads the location of the malfunction to the multi-function tester.

6. The apparatus of claim 5, wherein the multi-function tester determines whether the vehicle is not repaired and down-loads additional abnormality signals to the artificial intelligence computer for further processing if the vehicle is not repaired.

* * * * *